United States Patent
Klaren et al.

(10) Patent No.: US 6,806,768 B2
(45) Date of Patent: Oct. 19, 2004

(54) BALANCED POWER AMPLIFIER WITH A BYPASS STRUCTURE

(75) Inventors: Jonathan Klaren, San Diego, CA (US); Charles J. Persico, Rancho Santa Fe, CA (US); Scott Walter, San Diego, CA (US); Paul L. Chan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 462 days.

(21) Appl. No.: 10/039,936

(22) Filed: Oct. 31, 2001

(65) Prior Publication Data

US 2004/0095190 A1 May 20, 2004

(51) Int. Cl.[7] .............................. H03F 3/68; H03F 1/14
(52) U.S. Cl. .................................... 330/124 R; 330/51
(58) Field of Search ................................ 330/124 R, 51

(56) References Cited

U.S. PATENT DOCUMENTS

| | | | | |
|---|---|---|---|---|
| 4,490,684 A | * | 12/1984 | Epsom et al. | 330/149 |
| 4,656,434 A | * | 4/1987 | Selin | 330/84 |
| 6,208,202 B1 | * | 3/2001 | Kaufman et al. | 330/51 |
| 6,362,685 B1 | * | 3/2002 | Vagher | 330/124 R |

FOREIGN PATENT DOCUMENTS

| | | |
|---|---|---|
| DE | 2284226 | 9/1974 |
| EP | 0463231 | 12/1990 |
| GB | 2339093 | 1/2000 |
| WO | 0018004 | 3/2000 |

* cited by examiner

Primary Examiner—Patricia Nguyen
(74) Attorney, Agent, or Firm—Philip Wadsworth; Charles D. Brown; Howard H. Seo (57) ABSTRACT

A balanced power amplifier circuit arrangement comprises a driver amplifier stage (22) adapted to receive and amplify a signal. The amplified signal is input to a first coupler (26). The first coupler (26) produces an in-phase signal and an out-of-phase quadrature signal. A first power amplifier (38) receives and amplifies the in-phase signal. A second power amplifier (40) receives and amplifies the out-of-phase signal. A first switch (28) alternately connects an isolated port of the first coupler to ground (32) or a bypass path (36). A second coupler (42) receives and combines the amplified in-phase signal and the amplified out-of-phase signal to produce a combined signal. A second switch (30) alternately connects an isolated port of the second coupler (42) to either ground (34) or the bypass path (36). When the power amplifiers (38, 40) are powered down, the first coupler (26) splits the RF-signal into an in-phase signal and an out-of-phase signal. The power amplifiers (38, 40) appear as reflective impedances to the signal when they are powered down. Each signal reflects off the first and second power amplifiers (38, 40), respectively. The first coupler (26) combines the reflected signals and routes the combined signal through the bypass path (36) to the second coupler (42). The second coupler (42) splits the signal into an in-phase and out-of-phase signal and routes each to the power amplifiers (38, 40). The power amplifiers (38, 40) reflect each signal back to the second coupler (42). The second coupler (42) combines the signals and routes the combined signal to the RF-output port. The circuit arrangement enables the integration of the balanced amplifier and first and second couplers (26, 42) into a single power amplifier package to provide low power bypassing without the need of an external circulator component.

35 Claims, 9 Drawing Sheets

BALANCED POWER AMPLIFIER WITH A BYPASS STRUCTURE

BACKGROUND INFORMATION

I. Field of the Invention

The present invention relates generally to a balanced power amplifier circuit using improved power amplifier bypassing techniques. It is particularly useful in a wireless communication device, such as a CDMA wireless phone, but has other utilities as well.

II. Description of the Related Art

In various communication systems, including most hand-held wireless devices such as code-division-multiple-access (CDMA) cellular phones or any form of time-division-multiple access (TDMA) technology, RF power output from a mobile unit varies in large dynamic ranges. In a CDMA wireless system, multiple message signals are transmitted simultaneously on the same frequencies (spread spectrum). The signals are spread with different digital codes, thus allowing detection of the desired signal while the unintended signals appear as noise or interference to the receiver. Spread spectrum systems can tolerate some interference, and the interference added by each wireless transmitter increases the overall interference in each cell site. Each wireless transmitter introduces a unique level of interference, which depends on its received power level at the cell site.

The CDMA system uses power control to minimize mutual interference. Precise power control is critical to avoid excessive transmitter signal power that is responsible for contributing to the overall level of interference. The power transmitted by a particular wireless device is a function of its distance to the base station with which it is communicating and the number of other subscriber wireless devices in use talking to the same base station.

Figure 5:
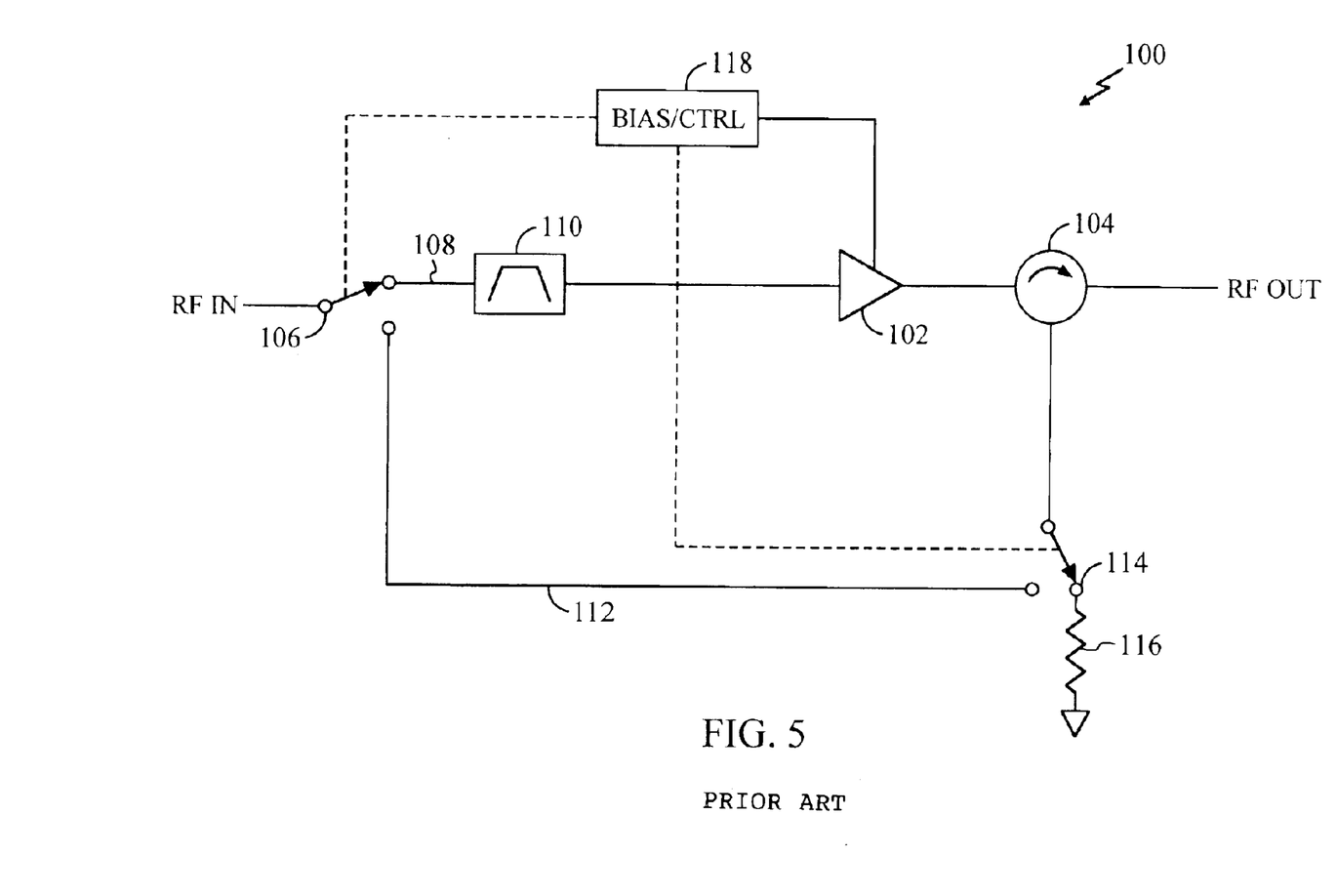
FIG. 5 is a plan drawing of a prior art single PA bypass circuit using a circulator.

In a typical hand-held wireless unit, the power amplifier ("PA") is biased class AB to reduce power consumption during periods of low transmit power, but power continues to be consumed. One arrangement to avoid continuous battery drain is to employ a switched bypass of a power amplifier, and then remove the DC power or power down the bypass amplifier. This arrangement is illustrated in FIG. 5. A single PA circuit 100 comprises a PA 102 and a circulator 104. Typically an isolator/circulator is used to isolate the PA from the effects of load impedance in subsequent stages. An RF-signal is inserted to a pole of a first switch 106. When the PA 102 is on, the first switch 106 connects the RF-input, via path 108, through a band-pass filter 110 to an input of PA 102. A second switch 114 connects the circulator 104 to ground through a terminating resistor 116. A biasing and control circuit 118 operates to bias the PA 102 and control the operation of the first and second switches 106, 114. The RF-signal is amplified and output to the circulator 104, and then transmitted to the RF-output port of the PA circuit 100.

When the PA 102 is powered down, its input and output appear as reflective impedances. Therefore the RF-signal must be routed around the PA 102. To accomplish bypassing, the first switch 106 connects the RF-input to a bypass path 112 and the second switch 114 routes the signal to the circulator 104. The RF-signal enters the circulator 104 from the second switch 114 and is routed to the output of the PA 102. The PA 102, appearing as a reflective impedance, reflects the RF-signal back to the circulator 104, which routes the signal to the RF-output port. This technique has drawbacks, however. When switches are used in the RF-output path, the switching loss must be overcome by the PA. Using the circulator 104 in the RF-output path removes the additional loss. However, using a circulator in the circuit requires another separate component from the PA, which consumes to circuit board space and cost. This can tend to cancel the benefits of bypassing. Furthermore, using a switch and a circulator requires more power to operate and is more costly to build.

Figure 6:
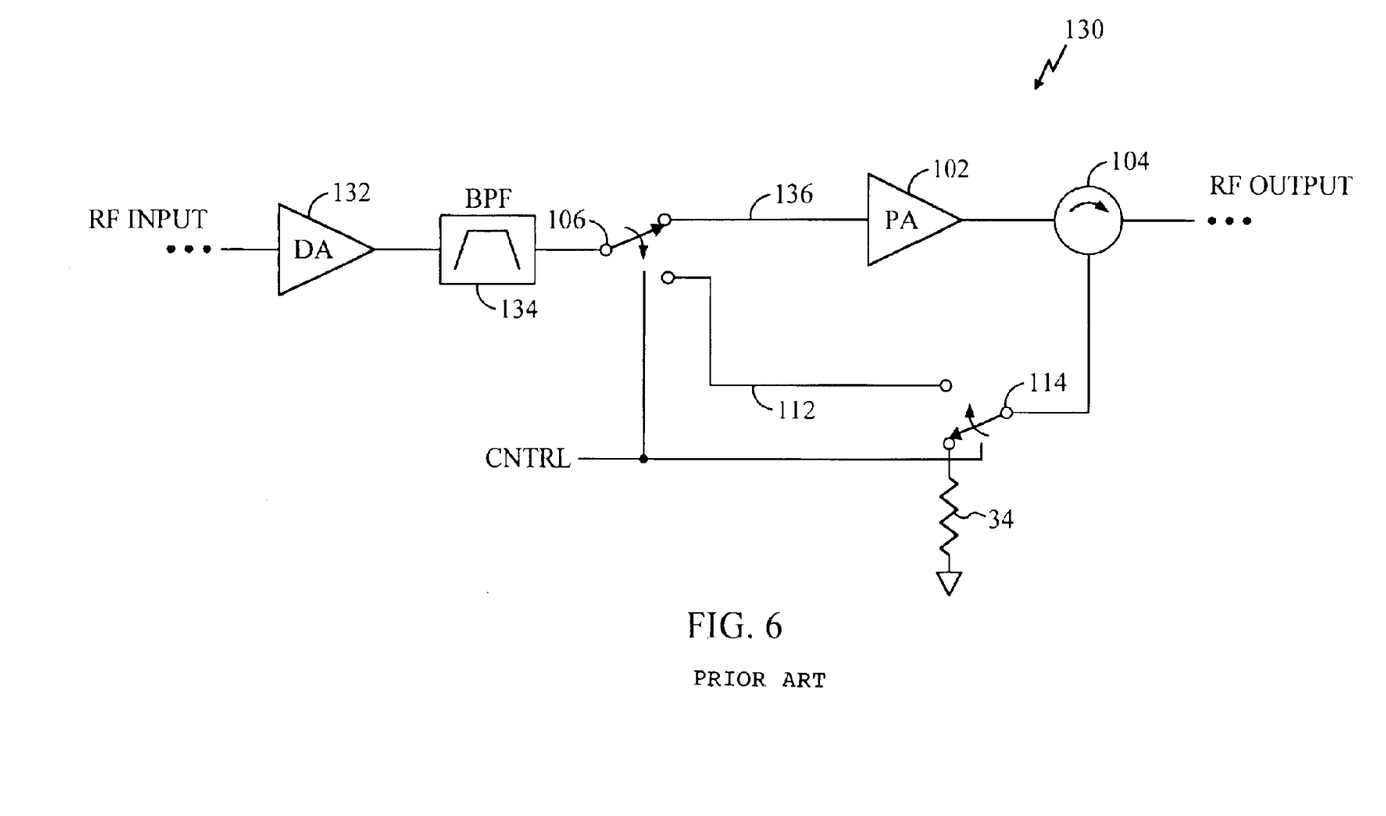
FIG. 6 is a plan drawing of a prior art PA bypass circuit using a circulator and a driver amplifier.

FIG. 6 illustrates a prior art single PA circuit 130. An analog signal is fed from a driver amplifier 132 through a band pass filter 134 to a first switch 106. The first switch 106 alternately routes the signal between a bypass path 112 and an amplifier path 136. In the amplifier path 136, a PA 102 amplifies the signal. A circulator 104 is connected between the output of the PA 102 and the RF-output port. A second switch 114 connects the circulator to either the bypass path 112 or ground through a terminating resistor 34. A control circuit controls the first switch 106 and the second switch 114. When bypassing the PA 102, the first switch 106 and the second switch 34 route the signal through the bypass path 112. The signal then enters the circulator 104 and routes to the output of the powered-down PA 102. The signal reflects off the PA 102 and back to the circulator 104, and routes to the RF-output port. While this approach provides the benefits of bypassing, it exhibits the same drawbacks as discussed above with regard to FIG. 5, wherein the circulator burdens the circuit with the need for a separate external component from the PA package. The configuration of FIG. 5 is also costlier to build when using the separate switch and circulator components. Added costs exist when the switches are external to the PA package, as well as other components. The need for external switches from the PA package also adds to the complexity of the circuit because a purchaser of the PA package must implement the bypass switches discretely.

Between FIG. 5 and FIG. 6, the circuit of FIG. 5 is preferable because the position of the band-pass filter permits more power to get to the output port and permits the circuit to bypass the loss associated with that band-pass filter. When you are in bypass mode, more of the available power from the driver amplifier (not shown in FIG. 5) is inserted into the bypass path and losses from the band-pass filter will not be experienced The need for the band-pass filter is alleviated in the bypass mode because in this mode less power is required and out-of-band spurious emissions due to the up-converter (not shown), which are normally filtered by the band pass filter, are not large enough to be detrimental.

The advantages of the circulator method PA bypass circuit include (1) saving current by turning the PA off when the high-power levels are not needed, (2) not requiring a switch directly in the large signal path, (3) avoiding loss, (4) reducing the size and cost by removing a switch, and (5) having a stepped gain which reduces the dynamic range requirement of a variable gain amplifier which precedes the PA.

The circulator-type power amplifiers as shown in FIGS. 5 and 6 have several drawbacks, however. The circulator requires more space in the circuitry of the mobile station because it is not integrated into the PA package. The circulator method introduces undesirable variability over many of the operating conditions of the PA. Finally, the circulator method is costly to manufacture because of the extra components required.

Some benefits are experienced by replacing the circulator with hybrid circuits which split the RF-signals into in-phase and out-of-phase signals, which are independently amplified in balanced amplifier circuits. Many of the benefits of using circulators or isolators are also achieved by using balanced amplifiers. Balanced amplifiers provide a high degree of stability, are useful in broadband applications, and provide protection from load mismatch. Balanced amplifiers also ensure that the amplifier will be linear in the event of a load mismatch. Another function of the circulator which is also achieved by balanced amplifier is to provide a good 50• termination to the duplexer which follows. The duplexer is a passive filter and is designed with specific terminations. The amplifier is matched not conjugately but for maximum linear power and when you look into the output of a power amplifier, it is not 50•. Thus you cannot directly connect an amplifier to a filter which is designed to work in a 50• system. Each function and advantage discussed above which is achieved by using a circulator is also achieved by using a balanced amplifier.

In a balanced amplifier, if one amplifier fails, the balanced amplifier unit will still operate but with ~6 dB reduced gain. Furthermore, balanced amplifiers are easily cascaded with other units, since each unit is inherently isolated.

Circulator-type prior art single power amplifiers as discussed above and balanced power amplifiers are illustrated in U.S. Pat. No. 6,060,949, which disclosure is incorporated herein in its entirety. However, balanced amplifiers still exhibit some disadvantages for wireless telephone applications, as will be discussed below.

Figure 7:
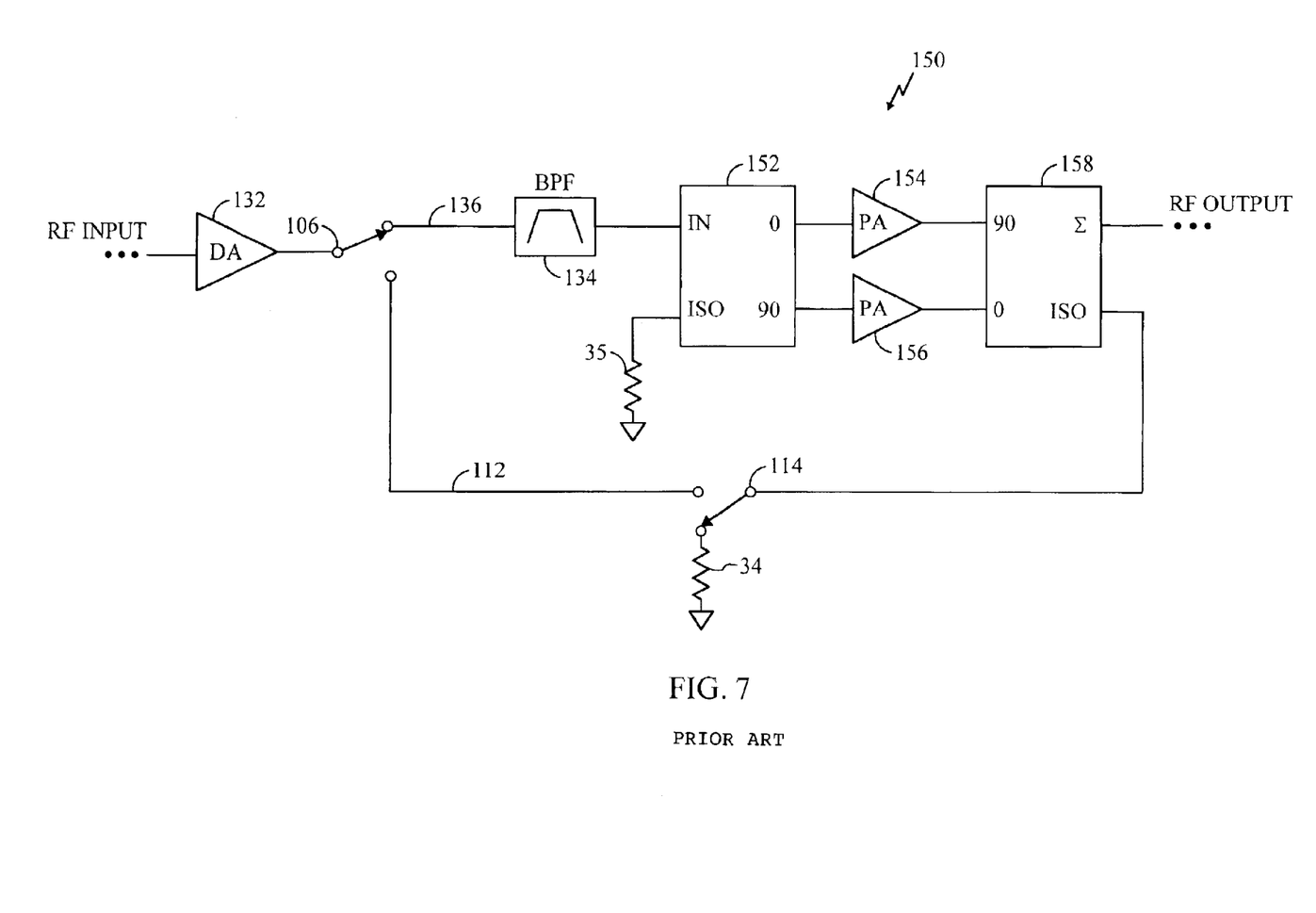
FIG. 7 is a plan drawing of a prior art PA bypass circuit with a balanced amplifier.

An example of a prior art balanced PA circuit using hybrid circuits is illustrated in FIG. 7. A balanced PA circuit 150 comprises a driver amplifier 132 producing an analog signal. The analog signal is switched by a first switch 106 between an amplifier path 136 and a bypass path 112. In the amplifier path 136, the signal is band-pass filtered 134, split by a first hybrid circuit 152 into an in-phase signal and a quadrature signal ninety degrees out of phase. The in-phase signal and the quadrature signal are each independently amplified by a first amplifier 154 and a second amplifier 156, respectively, which comprise the balanced amplifier stage. The in-phase signal is then shifted by 90° and summed with the out of phase signal in the second hybrid circuit 158. The resulting signal is filtered by a filter (not shown) and fed toward the RF-output port.

The isolated port of the first hybrid circuit 152 is grounded by a terminating resistor 35. The bypass path 112 provides a path from the first switch 106 to an isolated port of the second hybrid circuit 158. The signal is split into an in-phase signal and a quadrature signal by hybrid circuit 158. The in-phase signal is transmitted to the output of the first PA 156, which is powered down and therefore appears as a reflective load to the signal. The quadrature signal is transmitted to the output of the second PA 154, which is also powered down and therefore appears as a reflective load to the signal. Each reflected signal enters the second hybrid circuit 158, where the in-phase signal is shifted by 90-degrees and summed with the out-of-phase signal. The summed signal is output to the RF-output port.

When bypassing the power amplifiers, a second switch 114 connects the isolated port of the second hybrid circuit 158 to the bypass path 112, and the first switch 106 routes the input RF-signal to the bypass path 112. Therefore, when bypassing, the RF-signal is input to the second hybrid circuit 158, split into an in-phase and quadrature signal, reflected off the power amplifiers 154, 156 summed again by the second hybrid circuit 158, and transmitted out the RF-output port.

When the power amplifiers are needed, the first switch 106 routes the RF-input signal to the amplifier path 136 where the signal is split by the first hybrid circuit 134, amplified by the power amplifiers 154, 156, and summed by the second hybrid circuit 158 and routed to the RF-output port. The second switch 114 connects the isolated port of the second hybrid circuit 158 to ground through terminating resistor 34, which routes any reflected signal to ground.

The PA circuit illustrated in FIG. 7 also exhibits disadvantages, however. The design cannot be fully integrated into a PA package because of the manner the switches are utilized. Furthermore, the first switch 106 causes the RF-signal to split into the amplifier path or the bypass path. Therefore, there are two RF-inputs into the PA package. These disadvantages require extra switching components outside the PA circuit in order to accomplish the benefits of bypassing. Using the balanced amplifier configuration takes up more space when compared with a single amplifier. Accordingly, effective bypassing and compact packaging not addressed by the prior art are especially important when using balanced amplifiers in CDMA wireless telephone applications.

Employing a switch directly in the large signal path is taught in the prior art. For example, U.S. Pat. No. 5,661,434 to Brozovich et al. ("Brozovich et al.") discloses a multiple power level amplifier circuit. The disclosure of Brozovish et al. is incorporated herein by reference. Brozovich et al. disclose a two stage power amplifier circuit 34, 36. The first stage includes a power amplifier 26 with an input and output impedance matching networks 29, 30. The impedance matching network 30 matches the output impedance of the power amplifier 26 to the system characteristic impedance, which is defined by the load impedance at 36'. Thus, when the second stage amplifier 28 is bypassed, the output of the power amplifier 26 is matched.

In the low power mode of Brozovich et al., a signal-switching network in the second stage operates to bypass and power down the power amplifier 28. The switching network is controlled by a signal switch control 35, and includes an input isolation switch SW1, an output isolation switch SW2, and a bypass switch SW3. The input isolation switch SW1 is connected in series to the output of the power amplifier 28, the output isolation switch SW2 is connected in series to the output of the power amplifier 28, and the bypass switch SW3 is connected in parallel across the input isolation switch, the output isolation switch and the power amplifier 28. The extra switch SW2 at the output of the matching network from the power amplifier 28 exhibits the problems discussed above. Namely, the signal experiences insertion loss at the end of the amplifier stages due to SW2. Furthermore, switch SW2 is costly, large, and as an active device in line with the amplifier 28, must be as linear as the amplifier 28 in order to operate sufficiently. Furthermore, having active switches in series renders it difficult to integrate the switches and the amplifier in the same package.

SUMMARY OF THE INVENTION

What is needed in the art is a balanced PA circuit that is compact and which provides the benefits of bypassing the driver amplifier or balanced amplifier stage in order to conserve power.

In order to accomplish the objects of the present invention, a balanced amplifier circuit is provided which does not need an isolating switch as in Brozovich et al. or a circulator as in the prior art in order to simplify the design, space and cost of the PA circuit. The present invention decreases the cost and space required for a balanced PA circuit by removing the circulator and using couplers which can be integrated directly into the PA package. The present invention provides a PA circuit with the benefits of bypassing and which may be integrated into one PA package. Such a design provides substantially the same benefits of many of the operating conditions of the amplifier, such as load mismatch and temperature, while removing the need for an isolator or circulator. By providing a single PA package with the necessary circuit elements, a purchaser of the package need not separately implement switching using discrete components to accomplish bypassing. Furthermore, not requiring a switch in the large signal path avoid the loss at the end of the switch as well as the cost and size of that switch which are needed to avoid or reduce the loss and hence increased power consumption. An aspect of the present invention it to employ a bypassing method which avoids the need for a switch in the high power path.

These advantages and others may be realized by the invention disclosed herein. According to the first embodiment of the present invention, in a PA circuit, a band-pass filtered single RF-input signal is provided to a normal balanced amplifier. The amplified signal is input to a first coupler. The first coupler splits the signal and transmits an in-phase signal and an out-of-phase signal to a first PA and second PA, respectively. The first and second power amplifiers constitute the balanced stages of the circuit. A first amplified signal and a second amplified signal are respectively produced. The balanced amplifier stage transmits the first and second amplified signals to a second coupler. The first coupler's isolated port is connected via a first switch to a terminating resistor. Likewise, the second coupler's isolated port is connected via a second switch to a terminating resistor. A pole of the first switch and a pole of the second switch connect to a bypass path that connects the isolated ports of the first and second couplers together. The second coupler transmits a combination of the in-phase and out-of-phase amplified signals to the RF-output port.

In one mode of operation, the PA operates as a normal balanced amplifier, with the isolated ports of the respective first and second couplers terminated via the first and second switch respectively, to terminating resistors. In a second mode of operation, the balanced stages are powered down and thus present a highly reflective impedance at both output and input of the amplifier. In the second mode of operation, both the first and the second isolated ports of the couplers are connected together via the first and the second switches and the bypass path.

In the second mode of operation, the first coupler splits the input RF-signal into an in-phase signal and an out-of-phase signal between the balanced stages. The first and second PA, which are powered down and appear as reflective impedances, reflect the split signals. The reflected signals combine at the isolated port of the first coupler. The signal passes through the bypass path to the isolated port of the second coupler, which splits the signal into an in-phase signal and a out-of-phase signal. The in-phase and out-of-phase signals reflect off the output of the power amplifiers in the balanced stage. The second coupler combines the reflected signals and routes the combined signal to the RF-output port. In the preferred embodiment, the first switch is integrated into the PA package. But both switches may be integrated as well. This embodiment provides the advantage of using passive components in the couplers and using their isolated ports for bypassing which is achieved in a single integrated PA package without introducing active components.

According to a second embodiment of the present invention, the second isolated port of the second coupler of the first embodiment is connected directly to a terminating resistor without a switch. A third switch switches the RF-input between the PA path and a bypass path that bypasses the driver stage 1 and is connected to the first switch for inserting the RF-signal into the first coupler. In a first mode, the PA operates as an ordinary balanced amplifier, with high power output capability and gain. In a second mode, the driver stages are shut down and the RF-signal is input into the first coupler via the first isolated port. In this embodiment, the driver stages are bypassed and the coupler, driver stages, and the first switch are all integrated into a PA package. In the preferred implementation of this embodiment, the band pass filter is not integrated into the PA package but it is conceivable that it may be integrated into the package.

According to a third embodiment of the present invention, the single RF-signal is input to the driver amplifier stage, and the amplified signal is input to the first coupler. The isolated port of the first coupler is grounded. The first coupler routes the in-phase and out-of-phase signals to the first and second power amplifiers in the balanced amplifier stage. The amplified signals are input to the second coupler. The isolated port of the second coupler is connected via the second switch to either the 50 Ω termination or the output of a signal processor. The signal processor transmits a signal that cancels distortion caused by the power amplifiers. The signal processor generates the distortion compensation signal by coupling the input and output signals to a signal processing system, which may be either digital or analog or a mixture of the two. This minimizes the distortion in the RF-output signal. Since the injected signal is derived from the output signal, and reflects off the amplifier stages in the balanced amplifier, the distortion compensation signal changes the driving impedance seen by those devices.

In another aspect of the present invention, in each case discussed above where the isolated port of a coupler is terminated, the coupler may be replaced with any network that splits the power into equal amplitudes and introduces a quadrature 90-degree phase shift. The substitute network may be active or passive, and contain lumped and/or distributed passive elements. The advantages of the present invention generally involve using the isolated ports of the passive couplers to enable bypassing in a balanced amplifier configuration and to enable a single PA package to include the necessary integrated elements to achieve bypassing which reducing the need for discrete switches or other active components external to the package. It is also conceivable to use couplers or other equivalent networks known to those of ordinary skill in the art which introduce a 180-degree phase shift.

BRIEF DESCRIPTION OF THE DRAWINGS

The features and advantages of the present invention will become more apparent from the detailed description set forth below when taken in conjunction with the drawings in which like reference characters correspond throughout and wherein:

FIG. 4b is a branch-line coupler used in FIG. 4a;

DETAILED DESCRIPTION OF THE INVENTION

Figure 1:
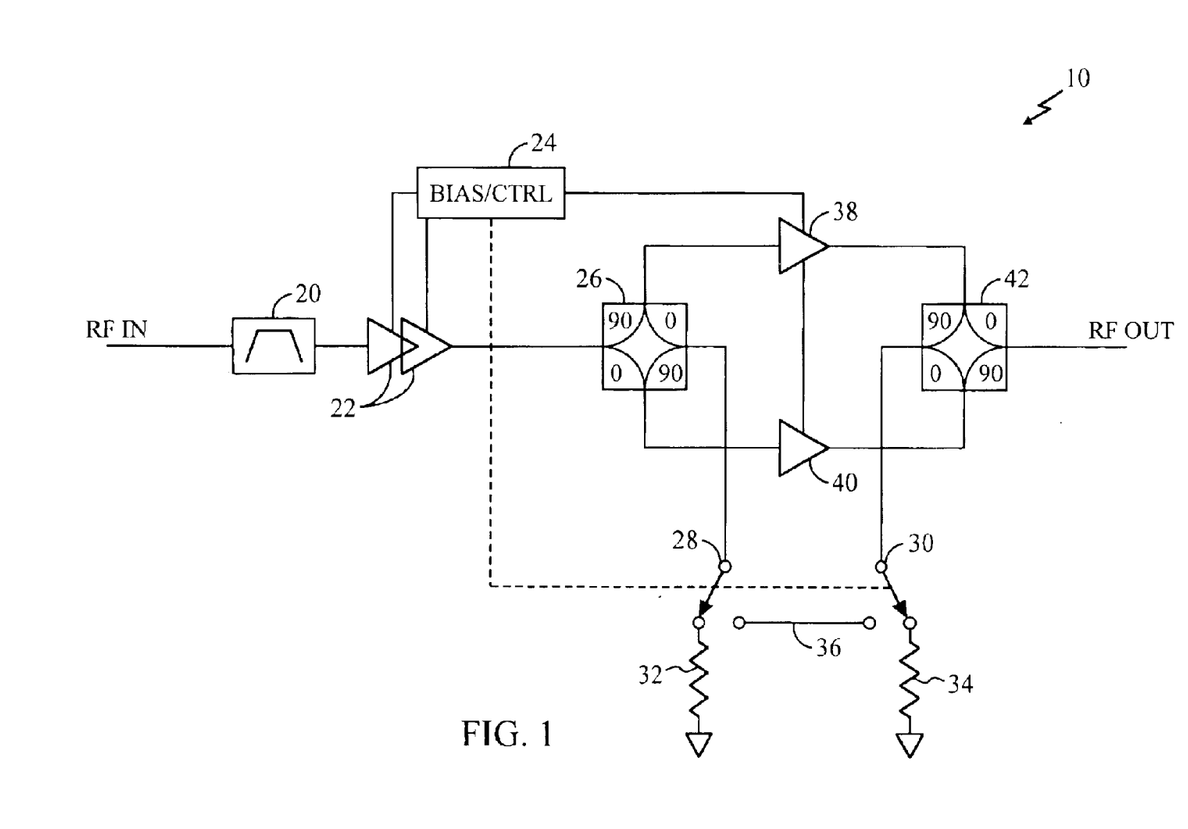
FIG. 1 is a plan drawing of a balanced PA bypass circuit according to the first embodiment of the invention.

FIGS. 1–3 and 4a illustrate in more detail the structure of power amplifiers 102 illustrated in FIGS. 5 and 6. The first embodiment of the invention is illustrated in FIG. 1 and relates to integrating the bypass path into the PA package. The benefits of integrating enable a purchaser of the amplifier package to have a two-terminal amplifier.

In a PA circuit 10, a single RF-input signal is band-pass filtered 20 and provided to an driver amplifier stage 22. Amplifier 22 constitutes the driver stages of amplifier 102 shown in FIGS. 5 and 6. The amplified signal is input to a first coupler 26, which splits the RF-signal into an in-phase signal and a 90-degree out-of-phase quadrature signal. The in-phase and quadrature signals output from the first coupler 26 are input respectively to a first PA 38 and second PA 40. The first and second power amplifiers 38, 40 constitute the balanced amplifier stage of the circuit and produces a first amplified signal and a second amplified signal, respectively. The first and second amplified signals are each input to a second coupler 42. The isolated port of the first coupler 26 is connected via a first switch 28 to ground through a first terminating resistor 32. Likewise, the isolated port of the second coupler 42 is connected via a second switch 30 to ground through a second terminating resistor 34. The terminating resistor 34 and switch 30 need to be able to withstand high power due to possible load mismatches. For example, a surface mount component may short to ground, an individual may place his or her hand on the antenna of the mobile station or may enter into an elevator. The power that returns from the antenna is incident on these elements through the output port of the second coupler 42. The amount of power that switch 30 and resistor 34 must handle depends on the largest VSWR expected in the system design, up to as much power as the PA is capable of producing.

In the present embodiment, the switch 30 and the termination resistor 34 are not integrated into the PA package, but it is encompassed in the concept of this invention that these elements could be integrated. Switch 28 and resistor 32 are integrated into the PA package. In the preferred embodiment, the bypass path 36 would be an output pin of the package and a pole of switch 30 would be an input pin of the package.

The second coupler 42 combines the in-phase and quadrature signal and outputs the combined signal to the RF-output port. Use of couplers in the present invention are advantageous because they do not require ferrite, which affords less variability over the operation conditions of the amplifiers. Circulators require ferrite, which has broad variations in performance during operating conditions, and under different temperatures in particular. It is inherently narrow band, and not to mention that a circulator or isolator is expensive and relatively large.

Balanced amplifiers with couplers according to the present invention allows bypassing to save current by turning off the bypassed PA when high power is not needed, removes the need for a switch in the large signal path, reduces loss due to active components, reduces the size of the total circuitry, and enables the use of stepped gain. Thus, the invention disclosed herein provides the same benefits as does the prior art circulator method but with many new advantages previously unavailable. The balanced amplifier with the passive couplers and the use of the isolated ports of the couplers provides all the benefits of using a circulator or an isolator and removes some of the disadvantages thereof.

A biasing and control circuit 24 biases the driver stage 22 and power amplifiers 38 and 40, and controls first switch 28 and second switch 30 in a manner well known to those of ordinary skill in the art. The number of amplifiers within and outside the balance amplifier configuration is irrelevant to the present invention. For example, the driver stage 22 may have one stage or zero stages, and there may be two stages for amplifier 38. Applicants envision that other equivalent structure is encompassed and envisioned as part of their invention in this regard.

In one mode of operation, the PA circuit 10 operates as a normal balanced amplifier, with the isolated ports of the first coupler 26 and second coupler 42 terminated via the first switch 28 and second switch 30 respectively, at ground. In a second mode of operation, the balanced stages 38, 40 are powered down and thus present a highly reflective impedance at both output and input. In the second mode of operation, first switch 28 and second switch 30 connect the isolated port of the first coupler 26 and the isolated port of the second coupler 42 via a pathway 36. The operation of the second mode of operation is now described.

In the second mode of operation, the RF-signal incident on the first coupler 26 is split into an in-phase signal and a 90-degree out-of-phase quadrature signal. The quadrature signal output from the first coupler 26 reflects back from the high impedance of the first PA 38, which is powered down. The in-phase signal output from the first coupler 26 reflects back from the high impedance of the second PA 40, which is powered down. The reflected signals combine in the first coupler 26. The combined signal passes to the isolated port of the second coupler 42 through pathway 36. The combined signal is split into an in-phase signal and a 90-degree out-of-phase quadrature signal which are respectively output to the second PA 40 and the first PA 38.

The in-phase signal reflects off the high impedance of the second PA 40 and the quadrature signal reflects off the high impedance of the first PA 38. The in-phase and quadrature signals recombine at the second coupler 42 and are output to the RF-output port. In this manner, the first PA 38 and the second PA 40 may be powered down and bypassed when high-power levels are not needed. Another advantage of this embodiment is that the switches 28, 30 may be integrated into the PA package. The band pass filter 20 is a relatively large structure and presently not integrated into the power amplifier package. However, it is envisioned that the band pass filter could be integrated in to the package to further save cost and space.

Figure 2:
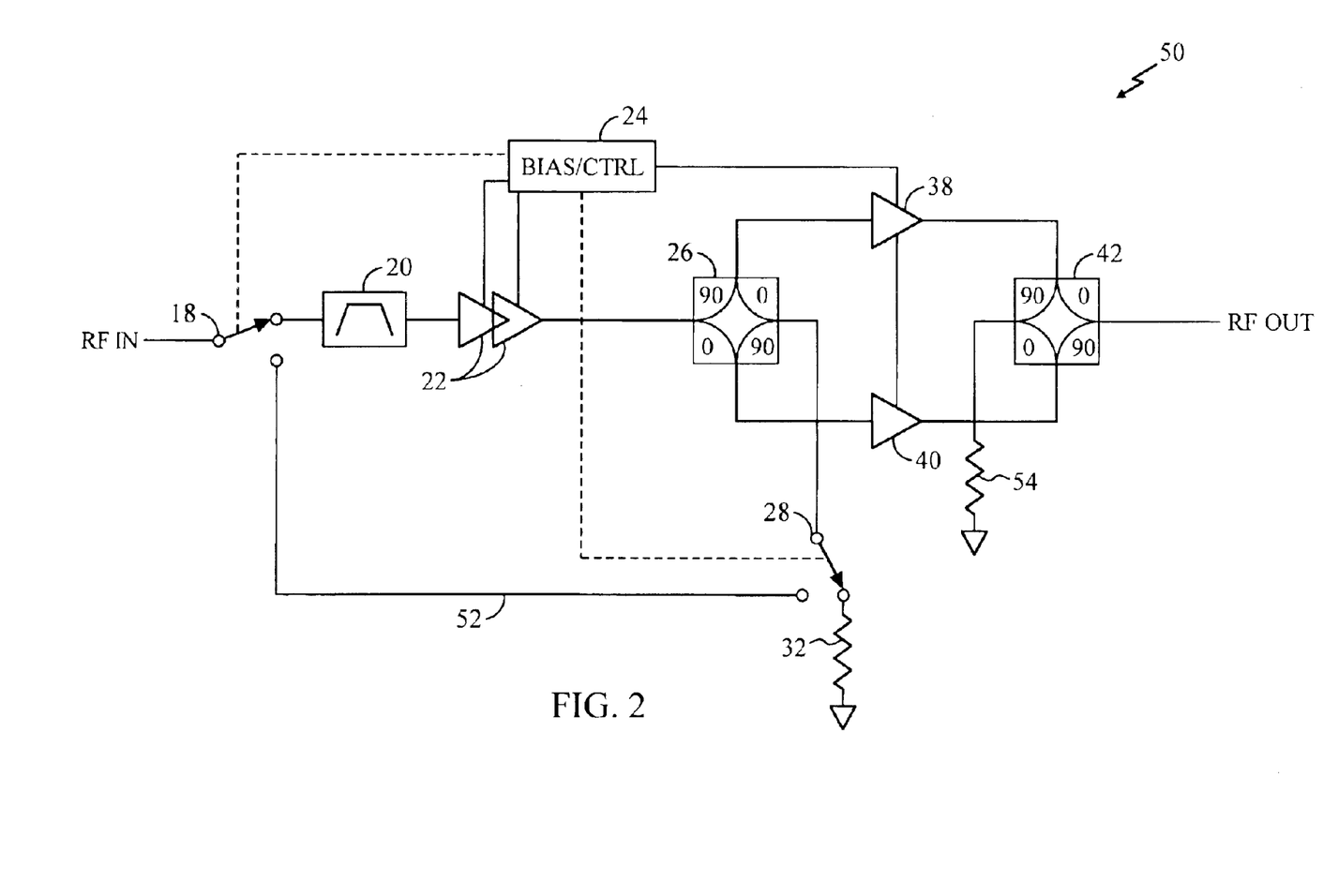
FIG. 2 is a plan drawing of a high power, low gain balanced PA bypass circuit according to a second embodiment of the present invention.

The second embodiment of the present invention is illustrated in FIG. 2, wherein similar circuit elements to the first embodiment are assigned the same reference numbers for consistency. The second embodiment relates to bypassing the PA or the driver stage of the PA but not bypassing the output stage. This configuration provides the ability to drive maximum output power or large output power. The configuration of FIG. 2 also changes the gain of the amplifier, which may be beneficial to the system in that it reduces the dynamic range required by the variable gain amplifier in the transmit chain. As integration of the PA components increases, all the circuits will be on the silicon chip, and the difficulty of isolation increases. Further, a large dynamic range is difficult to achieve in silicon due to isolation. The gain step relieves the dynamic range requirement. Changing the gain on the transmit path is beneficial to reduce the constraints on the amplifier.

The second embodiment of the invention provides high power capability by powering down and bypassing the initial amplifier stages 22. The PA circuit 50 comprises an input switch 18 that switches the RF-input signal between an amplifier path and a bypass path 52. In the amplifier path, the RF-signal is band-pass filtered 20 and input to an amplifier 22. The amplified signal from the amplifier 22 is input to the first coupler 26, where the signal is split into an in-phase and 90 degree out-of-phase quadrature signal. The isolated port of the first coupler 26 is alternatively connected via the first switch 28 to the bypass path 52 or ground through the first resistor 32. The quadrature signal output from the first coupler 26 is amplified by a first PA 38. The in-phase signal is amplified by the second PA 40.

The amplified signals from the first and second power amplifiers 38, 40 are recombined in the second coupler 42 and output to the RF-output port. The isolated port of the second coupler 42 is grounded through terminating resistor 54. Switch 18, terminating resistor 32 and switch 28 may or may not be integrated into the PA package. A biasing and control circuit 24 biases the driver stage 22 and power amplifiers 38 and 40, and controls first switch 28 and third switch 18 in a manner well known to those of ordinary skill in the art.

In a first mode of operation of the second embodiment of the invention, input switch 18 connects the RF-input signal to the amplifier path, and first switch 28 connects the isolated port of the first coupler 26 to ground via the first resistor 32. In the first mode of operation, the RF-input signal is amplified by the PA circuit 50 as described above for the signal in the amplification path. In the second mode of operation of the second embodiment of the invention, the input switch 18 connects the RF-input signal to the bypass path 52, and the first switch 28 connects the isolated port of the first coupler 26 to the bypass path 52. The driver amplifier stages 22 are powered down in order to conserve power in the circuit.

In the second mode of operation, the RF-input signal bypasses the band-pass filter 20 and driver stage 22, which is powered down. The RF-input signal is input to the isolated port of the first coupler 26 and split into an in-phase signal and a 90 degrees out-of-phase quadrature signal. The first coupler 26 outputs the in-phase signal and the quadrature signal. The in-phase signal is amplified by the first PA 38 and the quadrature signal is amplified by PA 40. The amplified in-phase and quadrature signals are combined by the second coupler 40 and output to the RF-output port. The second embodiment of this invention provides high output power capability but lower gain. The lower gain result of this configuration may be a desirable effect for a transmitter.

Figure 3:
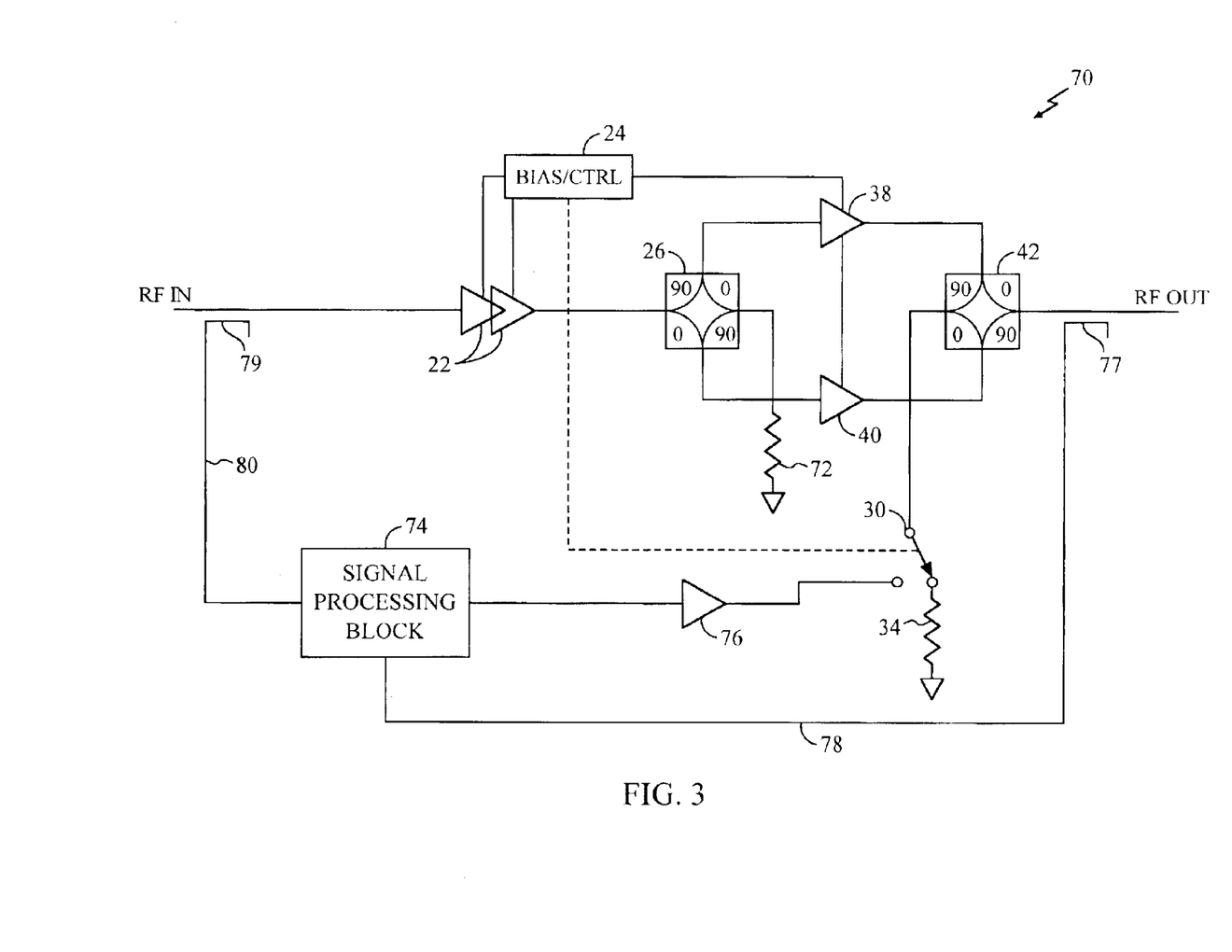
FIG. 3 is a plan drawing of a distortion compensation PA circuit according to the third embodiment of the present invention.

The third embodiment of this invention is illustrated in FIG. 3. In this embodiment, distortion compensation is provided in the PA circuit 70. An RF signal is input into the driver stage 22. The driven signal is inserted to the first coupler 26, where it is split into an in-phase and 90° out of phase signal. These signals are input to the first power amplifier 38 and second power amplifier 40 of a balanced amplifier, respectively. The isolated port of the first coupler 26 connects to a terminating resistor 72. The output of the first and second amplifiers 38, 40 is input to the second coupler 42, which combines the two amplified signals and transmits the combined signal to the RF output port. The isolated port of the second coupler 42 is connected to a switch 30. Switch 30 alternates connecting the isolated port of the second coupler 42 to either a terminating resistor 34 or the output of a signal processor 74 and buffer amplifier 76.

When switch 30 connects the signal processor 74 to the isolated port of the second coupler 42, the signal injected from the signal processor 74 is reflected off the first and second amplifiers 38, 40, combined in the second coupler 42 and then transmitted to the output port. A directional coupler 79 and directional coupler 77 sample the input RF signal and output RF signal respectively, and transmit the respective signals to the signal processor 74. The signal processor 74 compares the output to the input and produces an error correction signal that is injected into the isolated port of the second coupler 42. The error correction signal adds to the amplified signal being transmitted to the RF output port. Therefore, the third embodiment of the present invention uses the isolated port of the second coupler 42 to provide error correction to the RF signal. A biasing and control circuit 24 biases the driver stage 22 and power amplifiers 38 and 40, and controls switch 30 in a manner well known to those of ordinary skill in the art.

Some difficulties exist in this structure. When switch 30 is switched to buffer amplifier 76, any power reflected by the load may be inserted into the coupler 42 and incident upon buffer amplifier 76. However, if the error signal has a small amplitude, the buffer amplifier 76 need not be very large. An isolator or a attenuator (not shown) can then be placed between buffer amplifier 76 and switch 30 in order to isolate the buffer amplifier 176 from being damaged by reflected power.

In a first mode of operation of the third embodiment of the invention, the second switch 30 connects the isolated port of the second coupler 42 to a terminating resistor 34 and the PA circuit 70 operates as a regular balanced amplifier. In a second mode of operation, the second switch 30 connects the isolated port of the second coupler 42 to the output of the signal processor 74. The signal processor 74 output may be amplified by a PA 76 prior to being injected into the second coupler 42. The RF-input signal is coupled to the signal processing circuit 74 through a directional coupler 79 through a path 80. The RF-output signal is also coupled via a directional coupler 77 through a path 78 to the signal processing circuit 74. The signal processing circuit 74 produces an analog or digital distortion compensation signal which minimizes the distortion in the RF-output according to principles known to those of ordinary skill in the art for Feed Forward Amplifiers.

The distortion compensation signal is injected into the isolated port of the second coupler 42, is split into an in-phase and 90 degree out-of-phase quadrature signal. The in-phase signal reflects off the second PA 40 and the quadrature signal reflects off the first PA 38. Because the distortion compensation signal reflects off the balanced amplifier stages 38, 40 and is derived from the output signal, it effectively changes the impedance seen by the amplifier stages in the balanced amplifier 38, 40. Depending on the modulation type, it is within the contemplation of the present invention that the configuration could be used to change the load to make the amplifier more efficient or linear.

As far as integration into a single PA package, the preferred implementation of this invention does not integrate the processing block 74. It is envisioned as part of this invention that the processing block could be integrated into the same PA package in order to save cost and space. Buffer amplifier 76 could be integrated into the PA package or not. Paths 78 and 80 could be integrated into the PA package as well as passive elements such as the directional couplers 77 and 79. As one of ordinary skill in the art would understand, substrate technology provides a way to integrate passive multi-layer structures to implement couplers such as couplers 26 and 42 of FIG. 3.

In another aspect of the present invention, in each case above where the isolation port of a coupler is terminated to ground, the coupler could be replaced with any network that splits the power into equal amplitudes and introduces a 90-degree phase shift. Such equivalent or substitute networks could be either active or passive, and contain lumped and/or distributed passive elements. Such a substitute is illustrated in FIG. 4a.

Figure 4A:
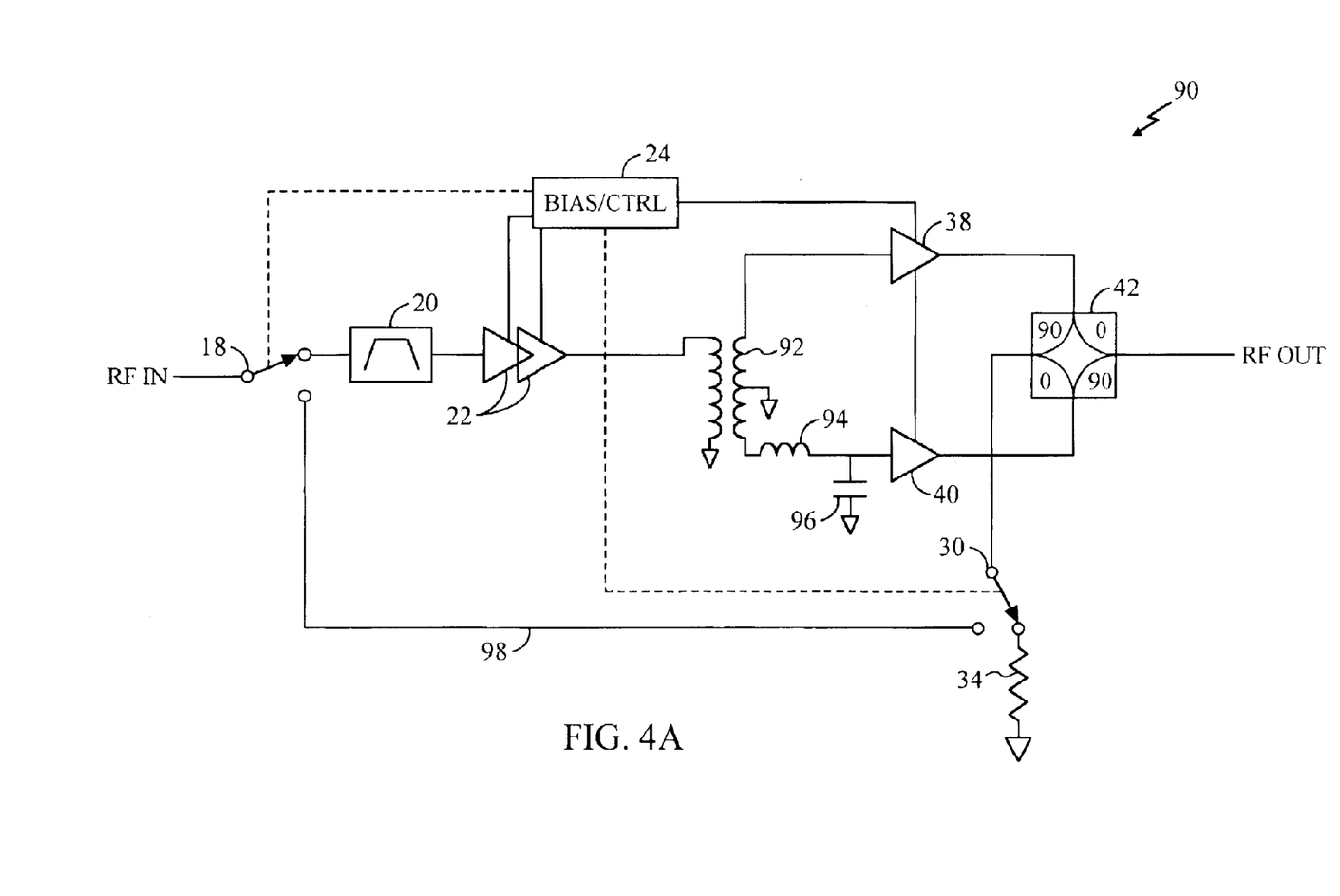
FIG. 4a is a plan drawing of a PA circuit wherein a coupler is substituted with a lumped network according to another aspect of the present invention.

FIG. 4a illustrates a variation of the second embodiment shown above in FIG. 2. A description of the various circuit elements discussed above is not repeated here. FIG. 4a illustrates that a four port hybrid coupler is not always necessary. Any network that provides a power split of equal amplitude and phase shift of 90 degrees will equivalently work. In FIG. 4a, the first coupler 26 (shown in FIG. 2) is replaced with a lumped power splitter/phase shifter and combiner 92, 94, 96, which splits the power into equal amplitudes and introduces a phase shift, for example, 90 degrees. The substitute network 92 may be active or passive. This element includes a phase shifting network consisting of a series inductor 94 and a shunt capacitor 96 to ground. Other distributed or lumped or combination thereof circuit are equivalent structures which accomplish the same objective. For example, a distributive structure, such as a Wilkenson divider, a rat-race coupler, a branch-line coupler, a simple lumped network, or a Lange and DeRonde coupler could equivalently be used.

Active circuits could also accomplish the same objective. A common-emitter stage which has an input at the base of the common emitter, and an emitter coupled pair connected together. The bias of each emitter would be adjusted so as to make the amplitude split right in the center. Using these systems you can obtain a 180-degree split rather than a 90-degree. A Π-network and a t-network could also be used which would introduce a plus 45-degree split and a minus 45-degree split (for a total 90-degree phase shift). These circuits are not illustrated herein but are each well known to those of ordinary skill in the art.

Figure 4B:
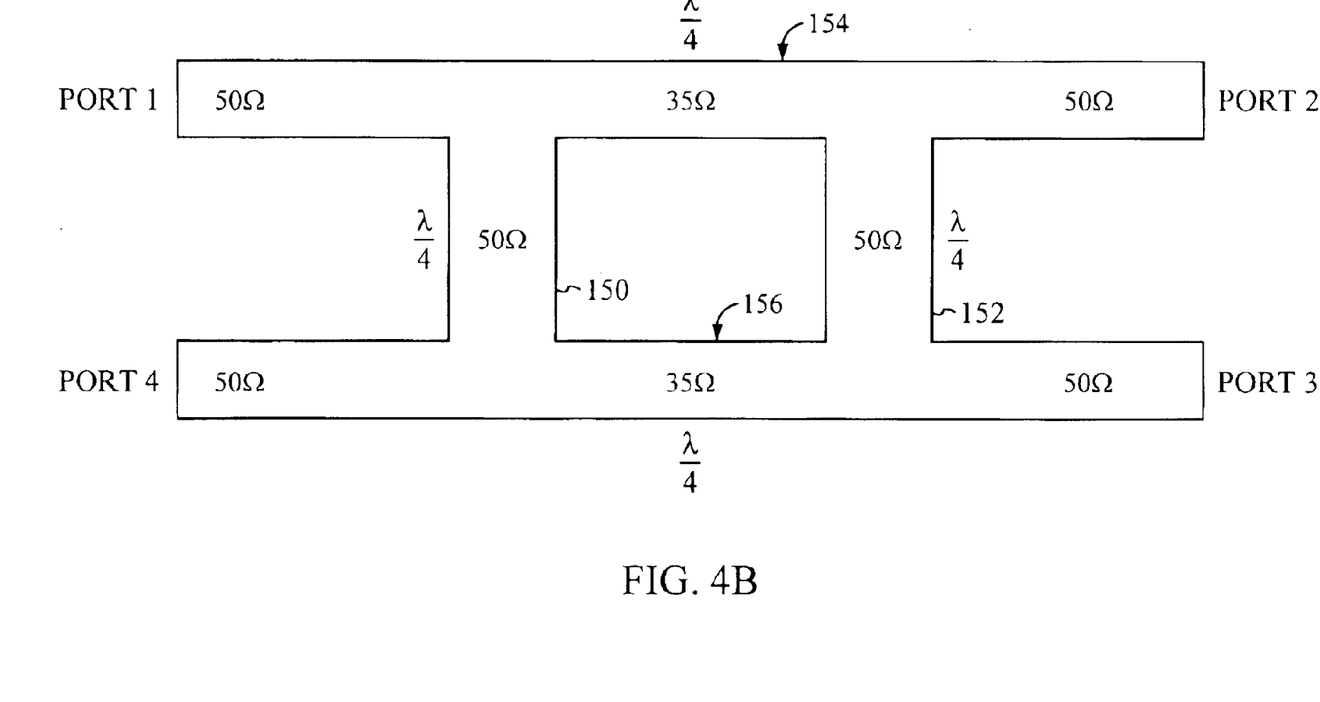

In the preferred embodiment, a branch-line coupler is used, as is shown in FIG. 4b. In a micro-strip implementation of a branch-line coupler, the ports 1–4 have an impedance of 50•. The parallel arms 150 and 152 each have an impedance of 50•. The lengths of arms 150 and 152 are each one quarter of the wavelength. Arms 154 and 156 each have an impedance of 35• and a length of one quarter wavelength. These amounts and lengths of the branch-line coupler are given by way of example only, and not by way of limitation. Other lengths and impedances may be employed and within the spirit of this invention.

Returning to the embodiment shown in FIG. 4a, a bypass path 98 connects a pole of an input switch 18 and a pole of switch 30. Switch 30 alternately connects the isolated port of the second coupler 42 with either ground through a terminating resistor 34 of the bypass path 98. Thus, when the input switch 18 connects the signal to the bypass path 98, and switch 30 connects the bypass path 98 to the second directional coupler 42, the initial amplifier stages 22 and the lumped network 92, 94, 96 are bypassed and the passes through the second directional coupler 42 and reflects off the power amplifiers 38, 40 to the RF-out as explained above. In each case where the isolated port of a coupler is unused or terminated, the lumped splitter/phase shifter and combiner 92, 94, 96 may be substituted as an equivalent structure.

Figure 4C:
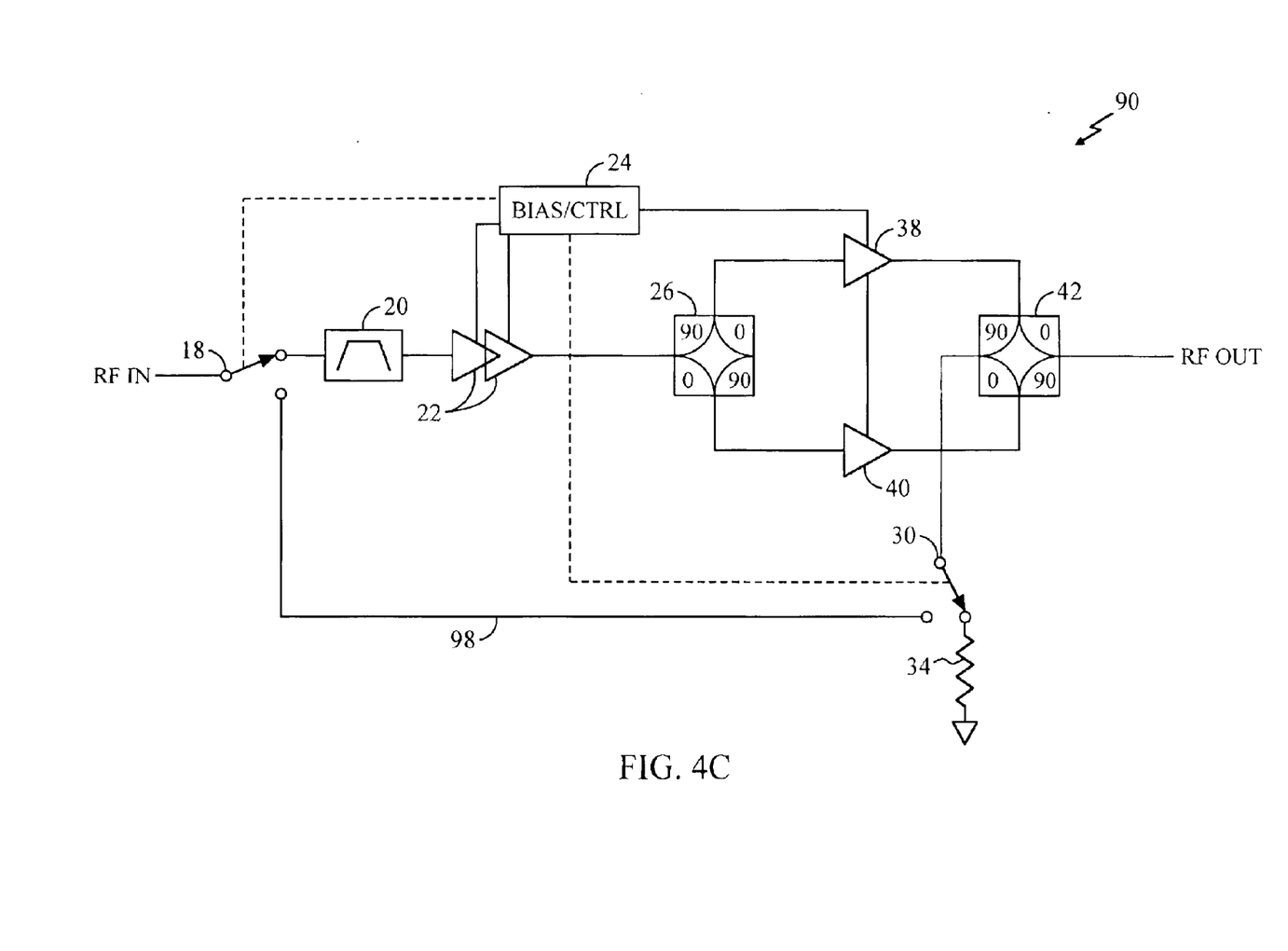
FIG. 4c is a plan drawing of a PA circuit wherein a the lumped network of FIG. 4a is replaced with a coupler.

In addition to replacing the first coupler 26 of FIG. 2 with lumped elements 92, 94, 96 in FIG. 4a, the bypassing circuit layout of FIG. 4a is modified as explained above. Since the lumped elements 92, 94, 96 of FIG. 4a are interchangeable with the first coupler 26 of FIG. 2, it will be understood that in the bypass circuit configuration of FIG. 4a, the lumped elements 92, 94, 96 may be replaced with the first coupler 26 of FIG. 2 and the bypass circuit 90 will operate to bypass the power amplifiers 22 and the first coupler 26 as discussed above. This variation is illustrated in FIG. 4c where the operation of the first coupler 26 and second coupler 42 with the power amplifiers 38, 40 is as described above in FIGS. 1 and 2 with the bypass network as described in FIG. 4a.

The improved PA circuits disclosed herein have particular application to CDMA wireless telephones. One application is for the cellular band an another is for the PCS band. Depending on the desirability and application to either the cellular or PCS band, different modifications will be made to conform the PA circuit to its particular application. However, other applications and uses of the compact size and power saving capabilities of the present invention are also contemplated by the inventors.

The previous description of the various embodiments of the invention are provided to enable a person of ordinary skill in the art how to make or use the invention. Various modifications to those embodiments will be readily apparent to those skilled in the art, and the generic principles defined herein may be applied to other embodiments without use of the inventive faculty. For example, the inventors of the present invention contemplate that 180-degree splitters and combiners may be used rather than the quadrature power splitters and combiners disclosed above. Thus, the present invention is not intended to be limited to the embodiments shown herein, but is to be accorded the widest scope consistent with the principles and novel features disclosed herein.

We claim:

1. A power amplifier circuit arrangement, comprising:
    a first circuit element which receives an input signal, said first circuit element producing an in-phase signal and an out-of-phase signal;
    a first power amplifier which receives and amplifies said in-phase signal;
    a second power amplifier which receives and amplifies said out-of-phase signal;
    a first switch which alternately connects an isolated port of said first circuit element between ground and a bypass path;
    a second circuit element which receives and combines said amplified in-phase signal and said amplified out-of-phase signal;
    a second switch which alternately connects an isolated port of said second circuit element to ground or said bypass path;
    a band-pass filter which receives a signal and outputs a band-passed signal; and
    a driver stage which receives said band-passed signal and produces said input signal to be transmitted to said first circuit element.

2. The power amplifier circuit arrangement of claim 1, wherein when said first amplifier and said second amplifier are powered down, said first and second switches connect said isolated ports of said first and second circuit elements via said bypass path in order to bypass said first and second amplifiers.

3. The power amplifier circuit of claim 1, wherein a bias and control circuit biases said driver stage, said first power amplifier, and said second power amplifier, said bias and control circuit also controlling said first and second switches.

4. The power amplifier circuit of claim 1, wherein said first circuit element is a coupler and said second circuit element is a coupler.

5. The power amplifier circuit of claim 1, wherein said first circuit element, said first power amplifier, said second power amplifier, said second circuit element, and said first switch are integrated into a single power amplifier package.

6. The power amplifier of claim 1, further comprising a first terminating resistor connected to a pole of said first switch, and a second terminating resistor connected to a pole of said second switch.

7. The power amplifier of claim 6, wherein said first circuit element, said first power amplifier, and said second power amplifier, said second circuit element, said first switch and said first terminating resistor are integrated into a single power amplifier package.

8. The power amplifier of claim 1, wherein said first circuit element, said first power amplifier, and said second power amplifier, said first switch and said first terminating resistor are integrated into a single package.

9. The power amplifier of claim 1, wherein said first circuit element is a branch-line coupler, and said second circuit element is a branch-line coupler.

10. The power amplifier of claim 7, wherein said second switch and said second terminating resistor are also integrated into said single package.

11. The power amplifier of claim 8, wherein said second switch and said second terminating resistor are also integrated into said single package.

12. The power amplifier of claim 1, wherein said first and said second power amplifiers constitute a balanced amplifier arrangement.

13. A power amplifier circuit arrangement, comprising:
a first switch which alternately switches an input signal between a bypass path and an amplifier path;
a driver stage positioned in said amplifier path and which receives said input signal and produces an amplified signal;
a first circuit element which receives said amplified signal and produces an in-phase signal and an out-of-phase signal;
a first power amplifier which receives and amplifies said in-phase signal;
a second power amplifier which receives and amplifies said out-of-phase signal;
a second switch which alternately connects an isolated port of said first circuit element to ground or said bypass path; and
a second circuit element which receives said amplified in-phase signal and said amplified out-of-phase signal and combines said in-phase and out-of-phase signals into an output signal, wherein an isolated port of said second circuit element is connected to ground.

14. The power amplifier arrangement of claim 13, wherein said first and said second power amplifiers are in a balanced amplifier arrangement.

15. The power amplifier circuit arrangement of claim 13, wherein when said driver stage is powered down, said first switch and said second switch connect said input signal to said bypass path in order to bypass said driver stage and inject said input signal to said first circuit element.

16. The power amplifier circuit arrangement of claim 13, further comprising a band-pass filter positioned between said first switch and said driver amplifier, said band-pass filter band-passing said input signal.

17. The power amplifier circuit of claim 13, wherein a bias and control circuit biases said driver stage, said first power amplifier and said second power amplifier, and said bias and control circuit controls said first switch and said second switch.

18. The power amplifier circuit of claim 13, wherein said first circuit element is a coupler and said second circuit element is a coupler, a first terminating resistor is connected to an isolated port of said second coupler, and a second terminating resistor is connected to a pole of said second switch.

19. The power amplifier circuit of claim 13, wherein said driver stage, said first circuit element, said second circuit element, said first amplifier, and said second amplifier are integrated into a single package.

20. The power amplifier circuit of claim 19, wherein said second switch and are second termination resistor are also integrated into said single package.

21. The power amplifier circuit of claim 18, wherein said first circuit element is a branch-line coupler and said second circuit element is a branch-line coupler.

22. A power amplifier circuit arrangement, comprising:
a first circuit element which receives an input signal and produces an in-phase signal and an out-of-phase signal, said first circuit element having a grounded isolated port;
a first power amplifier which receives and amplifies said in-phase signal;
a second power amplifier which receives and amplifies said out-of-phase signal;
a second circuit element which receives and combines said amplified in-phase signal and said amplified out-of-phase signal to produce an output signal;
a switch which alternately connects an isolated port of said second circuit element to ground or a signal distortion compensation path;
a signal processing circuit which receives a first coupled signal from said input signal and a second coupled signal from said output signal and produces a distortion compensation signal, wherein when said switch connects said isolated port of said second circuit element to said distortion compensation path, said distortion compensation signal being input to said isolated port of said second circuit element.

23. The power amplifier circuit of claim 22, further comprising a driver stage providing said input signal to said first circuit element.

24. The power amplifier circuit of claim 23, wherein a bias and control circuit biases said driver stage, said first power amplifier and said second power amplifier, and said bias and control circuit controls said switch.

25. The power amplifier circuit of claim 22, wherein said first circuit element is a coupler and said second circuit element is a coupler, and a first terminating resistor is connected to said isolated port of said first coupler.

26. The power amplifier circuit of claim 25, wherein a second terminating resistor is connected to a pole of said switch.

27. The power amplifier circuit of claim 22, wherein a third power amplifier amplifies said distortion compensation signal output from said signal processing circuit.

28. The power amplifier circuit of claim 22, where said first circuit element, said first power amplifier, said second power amplifier, said switch, and said second circuit element are integrated into a single package.

29. The power amplifier circuit of claim 24, where said first circuit element, said first power amplifier, said second power amplifier, said second circuit element, said switch, said driver stage, and said bias and control circuit are integrated into a single package.

30. The power amplifier circuit of claim 27, where said first circuit element, said first power amplifier, said second power amplifier, said second circuit element, said switch, and said third power amplifier are integrated into a single package.

31. In a power amplifier circuit arrangement comprising a first circuit element adapted receive an input signal and produce an in-phase signal and an out-of-phase signal, a first power amplifier connected to a first output of said first circuit element, a second power amplifier connected to a second output of said first circuit element, a first switch alternately connecting an isolated port of said first circuit element between ground and a bypass path, a second circuit element having a first poll connected to an output of said first power amplifier and a second port connected to an output of said second power amplifier, a second switch alternately connecting an isolated port of said second circuit element between ground and said bypass path, a method of bypassing said first and second power amplifiers comprising:

in a power amplifier bypass mode:
connecting said isolated port of said first circuit element to said bypass path using said first switch;
connecting said isolated port of said second circuit element to said bypass path using said second switch;
splitting said input signal into said in-phase signal and said out-of-phase signal using said first circuit clement;
reflecting said in-phase signal off said first power amplifier;
reflecting said out-of-phase signal off said second power amplifier;
combining said reflected in-phase and said out-of-phase signals at said first circuit element;
transmitting said combined signal from said isolated port of said first circuit element through said bypass path to said isolated port of said second circuit element;
splitting said combined signal into a second in-phase signal and a second out-of-phase signal in said second circuit element;
reflecting said second in-phase signal off said second power amplifier in said second circuit element;
reflecting said second out-of-phase signal off said first power amplifier; and
combining said reflected second in-phase and said reflected out-of-phase signals at said second circuit element to produce a combined signal; and in a power amplification mode;
connecting said isolated port of said first circuit element to ground by said first switch;
connecting said isolated port of said second circuit element to ground by said second switch;
splitting said input signal into said in-phase signal and said out-of-phase signal using said first circuit element;
amplifying said in-phase signal using said first power amplifier;
amplifying said out-of-phase signal using said second power amplifier;
combining said amplified in-phase and said out-of-phase signals at said second circuit element to produce a combined output signal;
receiving said input signal and amplifying said input signal using a driver stage;
controlling said first switch and said second switch using a bias and control circuit; and
biasing said driver stage, said first amplifier, and said second amplifier using said bias and control circuit.

32. In a power amplifier circuit arrangement comprising a driver amplifier receiving an input signal and producing an amplified signal, a first circuit element which receives said amplified input signal and produces an in-phase signal and an out-of-phase signal, a first power amplifier connected so a first output of said first circuit element, a second power amplifier connected to a second output of said first circuit element, a first switch alternately routing said input signal to said driver amplifier or a bypass path, a second circuit element having a first port connected to an output of said first power amplifier and a-second port connected to an output of said second power amplifier, said second circuit element having a grounded isolated port, a second switch alternately connecting an isolated port of said first circuit element between ground and said bypass path, a method of bypassing said driver amplifier comprising:

in a driver amplifier bypass mode:
routing said input signal to said bypass path using said first switch;
connecting said isolated port of said first circuit element to said bypass path via said second switch;
splitting said input signal into said in-phase signal and said out-of-phase signal using said first circuit element;
amplifying said in-phase signal using said first power amplifier and transmitting said amplified in-phase signal to said second circuit element;
amplifying said out-of-phase signal using said second power amplifier and transmitting said amplified out-of-phase signal to said second circuit element;
combining said amplified in-phase and said amplified out-of-phase signals at said second circuit element;
transmitting said combined signal to an RF-output port; and in a power amplification mode:
routing said input signal to said driver amplifier by said first switch;
connecting said isolated port of said first circuit element to ground by said second switch;
splitting said input signal received from said driver amplifier into said in-phase signal and said out-of-phase signal using said first circuit element;
amplifying said in-phase signal using said first power amplifier and transmitting said amplified in-phase signal to said second circuit element;
amplifying said out-of-phase signal using said second power amplifier and transmitting said amplified out-of-phase signal to said second circuit element;
combining said amplified in-phase and said amplified out-of-phase signals at said second circuit element; and
transmitting said combined signal to an RF-output port.

33. The method of bypassing the driver amplifier of claim 30, further comprising:

controlling said first switch and said second switch using a bias and control circuit; and biasing said driver stage, said first amplifier, and said second amplifier using said bias and control circuit.

34. In a power amplifier circuit arrangement, comprising a driver stage receiving an input signal and producing an amplified signal, a first circuit element which receives said amplified input signal and produces an in-phase signal and an out-of-phase signal, said first element having a grounded isolated port, a first power amplifier connected to a first output of said first circuit element, a second power amplifier connected to a second output of said first circuit element, a second circuit element having a first port connected to an output of said first power amplifier and a second port connected to an output of said second power amplifier, said second circuit element having an isolated port and said second circuit element producing an output signal, a signal processing element which couples said input signal with said output signal and produces a distortion compensation signal in a distortion compensation path, a switch alternately connecting said isolated port of said second circuit element between ground and a distortion compensation path, a method of providing distortion compensation comprising:

coupling said signal processing element to said input signal and said output signal;

producing a distortion compensation signal corresponding to said input signal and said output signal, said distortion compensation signal generated to cancel distortion caused by said first and second amplifiers;

connecting said distortion compensation path from said signal processing element to said second circuit element using said switch;

inserting said distortion compensation signal into said second circuit element; and canceling distortion within said input signal using said distortion compensation signal.

35. The method of bypassing the driver stage of claim 34, further comprising:

controlling said switch using a bias and control circuit; and biasing said driver amplifier, said first amplifier, and said second amplifier using said bias and control circuit.

* * * * *